(12) United States Patent
Madrid

(10) Patent No.: US 7,023,077 B2
(45) Date of Patent: Apr. 4, 2006

(54) CARRIER WITH METAL BUMPS FOR SEMICONDUCTOR DIE PACKAGES

(75) Inventor: Ruben Madrid, Cebu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/799,895

(22) Filed: Mar. 11, 2004

(65) Prior Publication Data
US 2004/0232542 A1 Nov. 25, 2004

Related U.S. Application Data

(62) Division of application No. 09/855,820, filed on May 14, 2001, now Pat. No. 6,893,901.

(51) Int. Cl.
*H01L 29/72* (2006.01)
(52) U.S. Cl. .................. 257/678; 257/679; 257/680
(58) Field of Classification Search ................ 257/668, 257/669, 670, 678, 679, 680
See application file for complete search history.

(56) References Cited

U.S. PATENT DOCUMENTS

| 5,123,163 | A | * | 6/1992 | Ishikawa et al. ............ 29/827 |
| 5,892,271 | A | * | 4/1999 | Takeda et al. ............ 257/668 |
| 6,133,634 | A |  | 10/2000 | Joshi |
| 6,144,101 | A |  | 11/2000 | Akram |
| 6,489,204 | B1 | * | 12/2002 | Tsui ........................... 438/270 |
| 2002/0050912 | A1 | * | 5/2002 | Shrier et al. ................. 338/21 |
| 2002/0074147 | A1 | * | 6/2002 | Tan et al. ................. 174/52.4 |

FOREIGN PATENT DOCUMENTS

EP        978871 A2    2/2000

* cited by examiner

*Primary Examiner*—Edward Wojciechowicz
(74) *Attorney, Agent, or Firm*—Townsend and Townsend and Crew LLP

(57) ABSTRACT

A carrier for a semiconductor die package is disclosed. In one embodiment, the carrier includes a metal layer and a plurality of bumps formed in the metal layer. The bumps can be formed by stamping.

17 Claims, 15 Drawing Sheets

CARRIER WITH METAL BUMPS FOR SEMICONDUCTOR DIE PACKAGES

CROSS REFERENCE TO RELATED APPLICATIONS

This application is a divisional of U.S. patent application Ser. No. 09/855,820, filed on May 14, 2001, U.S. Pat. No. 6,893,901 which is herein incorporated by reference in its entirety for all proposes.

BACKGROUND OF THE INVENTION

Solder balls are used as electrical interconnects in ball grid array (BGA) packages. In a BGA package, an array of solder balls is used to couple a semiconductor die to a circuit substrate such as a printed circuit board (PCB).

A method that can be used to form a BGA package is the solder ball attach process. In a solder ball attach process, solder balls are mechanically placed on a ball land pattern of conductive regions in a semiconductor carrier or substrate. After the solder balls are placed on the specified ball land pattern, the semiconductor die is flipped over and is mounted on a circuit substrate.

The solder balls typically have a lead-based solder alloy. For example, the solder alloy may be a near eutectic tin-lead (Sn—Pb) alloy that melts at about 183° C. When the solder balls are present between the semiconductor die and the circuit substrate, the balls are heated to a temperature at or below the melting temperature of the solder alloy. The purpose of heating the balls below melting point is to ensure that the solder balls do not collapse. The solder balls are fluxed and re-flowed to join the circuit substrate to the semiconductor die. During fluxing, oxides in the solder are removed and the conductive surfaces of the semiconductor die and the circuit substrate are wet with the melting solder. After fluxing and re-flow, solder interconnects are formed between the semiconductor die and the circuit substrate. The formed solder interconnects electrically couple the circuit substrate and the semiconductor die together.

FIG. 1 shows a semiconductor die package. In the die package, a carrier 100 is provided with a rectangular cavity 100-1 that receives a semiconductor die 102. In this example, the semiconductor die comprises a vertical metal oxide field effect transistor (MOSFET) and is in a Ball Grid Array-type package (BGA). An array of solder balls 108 is on the surface of semiconductor die 102 as well as on an edge surface 106 of the carrier 100. The solder ball array 108 is divided into two groups. A first outer array of solder balls 108-2 connects to the carrier edge surface 106 and an internal array of solder balls 108-1 connects to the die surface. The array of solder balls 108 can be mounted and coupled to a circuit substrate such as a circuit board.

The outer array of solder balls 108-2 provides the connection to the drain terminal of the MOSFET, while the inner array of solder balls 108-1 provides the connection to the source and gate terminals of the MOSFET. A corner solder ball 108-3 can be dedicated for the gate terminal and the remaining solder balls 108-1 in the inner array 108-1 provide for a distributed, low resistance connection to the source terminal of the BGA MOSFET.

Solder ball technology could be enhanced and improved to provide for a more robust design. For example, the strength of adhesion of the ball interconnects could be improved. Solder interconnects formed using a ball attach process can break if they are weak. If one or more solder interconnects fail in a die package, the entire package can be inoperative. In addition, during processing (e.g., during reflow), the solder balls deform. The deformation can cause the solder balls in the array to have varying heights. As a result, the ends of the solder balls may not be coplanar with each other. If, for example, some of the solder balls on an array of conductive pads are taller than other solder balls in the array, the shorter solder balls may not make contact with both the semiconductor die and the circuit substrate. The formed die package could be inoperative due to the faulty solder interconnects. Also, solder balls can move during processing. If the solder balls move from their intended locations, the desired interconnections may not be formed in the semiconductor die package. Lastly, many solder balls contain lead. Lead is not an environmentally friendly substance. It would be desirable to reduce if not to eliminate the amount of lead used in a semiconductor die package.

Embodiments of the invention address these and other problems.

SUMMARY OF THE INVENTION

An embodiment of the invention is directed to a carrier for a semiconductor die package, the carrier comprising: (a) a metal layer; and (b) a plurality of bumps formed in the metal layer, wherein the carrier is for electrically coupling a semiconductor die to a circuit substrate.

Another embodiment of the invention is directed to a semiconductor die package comprising: (a) a carrier comprising a metal layer, a die attach region, and a plurality of bumps formed in the metal layer; and (b) a semiconductor die electrically coupled to the die attach region of the carrier.

Another embodiment of the invention is directed to a semiconductor die package comprising: (a) a carrier comprising metal layer, a die attach region, and a plurality of stamped bumps formed in the metal layer around the die attach region; (b) a semiconductor die comprising a vertical metal oxide semiconductor field effect transistor (MOSFET) device having a source region, a gate region, and a drain region, wherein the drain region is electrically coupled to and proximate to the die attach region of the carrier, and the source region and the gate region are distal to the die attach region, and wherein the plurality of stamped bumps in the carrier are arranged around the semiconductor die; and (c) a plurality of solder deposits disposed on the semiconductor die.

Another embodiment of the invention is directed to a method for forming a carrier comprising: (a) providing a metal layer; and (b) forming a plurality of bumps in the metal layer to form the carrier.

Another embodiment of the invention is directed to a method for forming a carrier for a semiconductor die package, the method comprising: (a) providing a metal layer; and (b) forming a plurality of bumps in the metal layer, wherein the formed bumps are capable of being electrically coupled to conductive regions of a circuit substrate.

These and other embodiments of the invention are described in further detail below.

DETAILED DESCRIPTION

Figure 1:
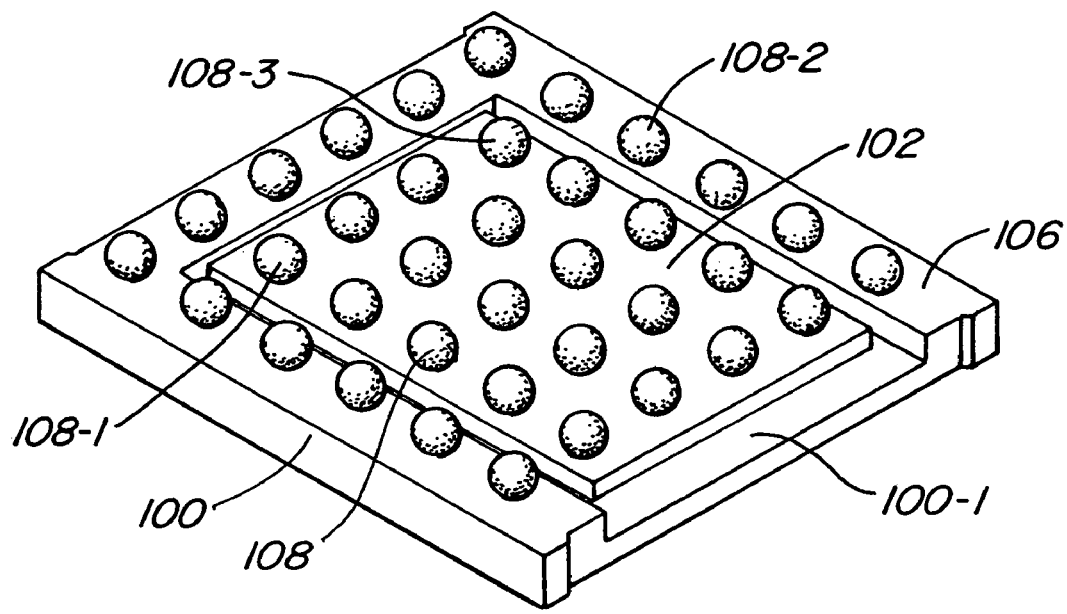
FIG. 1 shows a perspective view of a semiconductor die package with solder balls.

Embodiments of the invention relate to carriers for semiconductor die packages, semiconductor die packages including the carriers, methods for making the carriers, and the methods for assembling semiconductor die packages. The semiconductor die packages can be, for example, MOSFET BGA packages, thin MOSFET packages, or any other type of semiconductor IC or discrete die package.

The carriers according to embodiments of the invention comprise a metal layer such as a copper layer. Plural bumps are formed in the metal layer and the bumps may be arranged in a predetermined configuration. For example, the bumps may be in a regularly spaced array across the metal layer or may be at the periphery of the metal layer. In some embodiments, the bumps may be arranged around a planar die attach region of the carrier. A semiconductor die can then be attached to the die attach region using, for example, solder paste or a conductive adhesive. A number of solder paste deposits (e.g., solder balls) can be on the surface of the semiconductor die opposite the carrier.

The bumps can be formed by stamping a metal layer. Any suitable stamping apparatus may be used to form the bumps. An exemplary stamping apparatus can comprise a stamping machine having multiple stamping elements (sometimes referred to as stamping tools), and a corresponding stamping die. The stamping die has recesses that are configured to receive the multiple stamping elements. In an exemplary process, a metal layer is placed on the stamping die. The stamping elements punch the metal layer while it is on the stamping die. During punching, the stamping elements push portions of the metal layer into the recesses of the stamping die without passing through the metal layer. The pressure applied to the metal layer deforms portions of the metal layer to form multiple stamped bumps in the metal layer. This stamping process can be repeated so that sets of bumps are formed in the metal layer. After stamping the sets of bumps, multiple carriers are formed. The formed carriers can be separated from each other after the semiconductor dies are assembled to the individual carriers to form individual packages. The separated packages can be mounted to a circuit substrate such as a circuit board. In some embodiments, the carrier can be considered a "lead frame" that electrically couples a semiconductor die to a circuit substrate such as a circuit board.

The embodiments of the invention have a number of advantages. For example, in embodiments of the invention, the bumps in the carrier can replace interconnects that would otherwise be made using solder. As a result, less solder can be used in the assembly of the semiconductor die packages. The embodiments of the invention have fewer solder balls as compared to other semiconductor die packages that have all solder balls as interconnects. Embodiments of the invention are therefore more environmentally friendly than other types of semiconductor die packages. In addition, reducing the number of pure solder interconnects simplifies the interconnect process. As the number of pure solder interconnects is reduced in embodiments of the invention, the number of solder balls that need to be placed on a semiconductor die or a circuit substrate is reduced. Moreover, because fewer solder interconnects are used in embodiments of the invention, the problems associated with forming many pure solder interconnects are reduced or eliminated. For example, as explained above, solder balls can deform during processing. The solder ball heights may be inconsistent and the ends of the solder balls may not be coplanar with each other. In comparison, the stamped bump interconnects in embodiments of the invention are integrally formed in a carrier and are more robust than solder interconnects. Unlike pure solder interconnects, stamped bumps can be made with repeatable dimensions and can be consistently spaced with respect to each other. Also, compared to solder based interconnects, the stamped bumps exhibit superior electrical and thermal performance. For example, in the carrier embodiments, the stamped bumps and the portion of the carrier that contacts the semiconductor die may be formed from a single unitary material. Electrical current can flow from the portion that contacts the semiconductor die to the stamped bumps without passing through a material interface such as a solder to metal interface. Electrical current passes to the bumps without any loss in efficiency that might be caused by the presence of a material interface such as a solder to metal interface. Also, the carriers according to embodiments of the invention can be manufactured in high volumes. Stamping interconnect structures is faster than mechanically placing solder balls on a circuit substrate or a semiconductor die.

Figure 2:
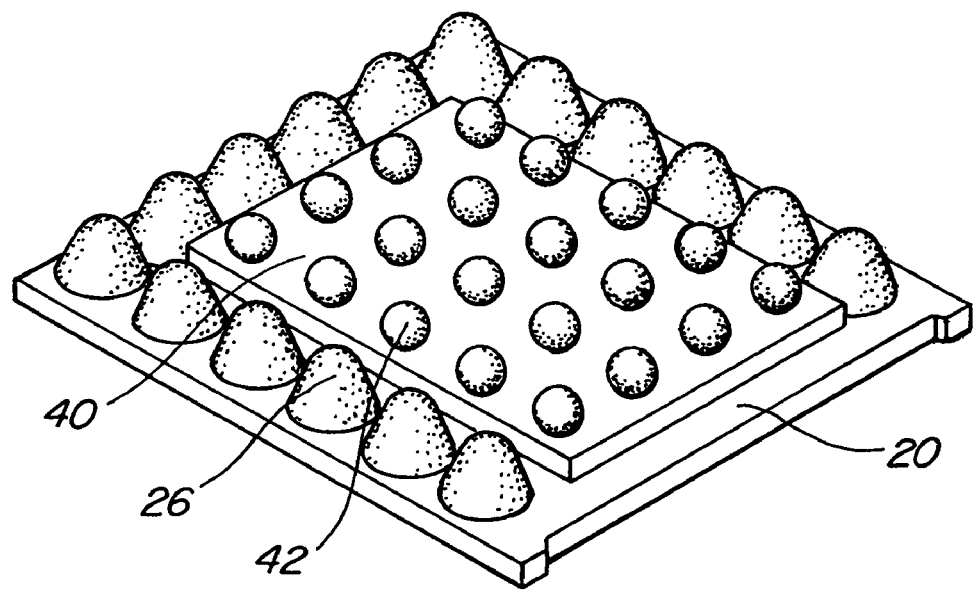
FIG. 2 shows a perspective view of a semiconductor die assembled on a carrier according to an embodiment of the invention.

An embodiment of the invention is shown in FIG. 2. FIG. 2 shows a semiconductor die package. The package comprises a carrier 20 comprising a metal layer that has a die attach region and a plurality of stamped bumps 26 around the die attach region. A semiconductor die 40 comprising a vertical metal oxide semiconductor field effect transistor (MOSFET) is electrically coupled to and is proximate to the die attach region of the carrier 20. Solder 42 (e.g., solder balls or solder columns) can be on the semiconductor die 40.

Figure 3:
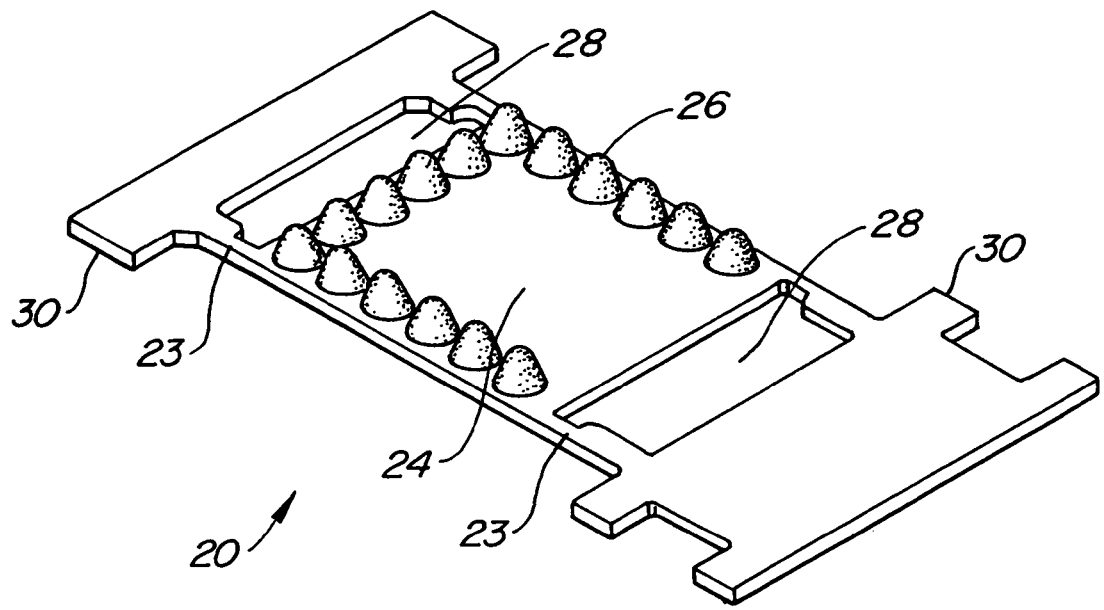
FIG. 3 shows a perspective view of a carrier according to an embodiment of the invention

FIG. 3 shows a carrier 20 according to an embodiment of the invention. The carrier 20 includes a number of stamped bumps 26 formed around a die attach region 24. In this example, two windows 28 are disposed around and at the periphery of the die attach region 24. The windows 28 are partially defined by tie bars 23. The tie bars 23 can be cut after a semiconductor die is attached to the die attach region 24 to form a functional unit of a MOSFET BGA package. Side rails 30 are disposed on both sides of the carrier 20. The side rails 30 hold the carriers and the portions of the processed metal layer that will be formed into carriers together during the stamping process.

The carrier 20 may comprise any suitable material. For example, the carrier 20 may comprise a base metal such as copper or aluminum. Metals such as these are good electrical and thermal conductors. In some embodiments, the carrier 20 can include a layer of metal that includes a base metal such as copper and one or more sublayers of material on the base metal. Exemplary sublayers may include adhesion layers, diffusion barriers, solder wettable layers, and oxidation barrier layers. For example, in some embodiments, the carrier 20 and the unstamped metal layer used to form the carrier may comprise a copper base coated with a metal such as a nickel-palladium alloy, nickel, or a nickel alloy. The layers on the base metal may be formed before or after bumps are formed in the base metal. In yet other embodiments, the carrier can comprise a dielectric material. Embodiments of this type are described in greater detail below with reference to FIGS. 14*a* to 14*e*.

Figure 4:
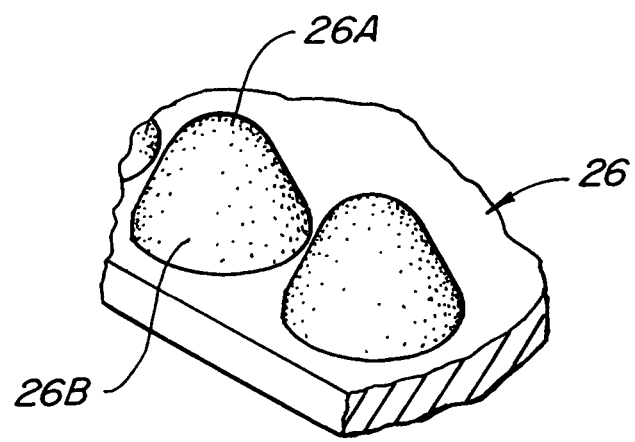
FIG. 4 shows a close-up, perspective view of bumps of a carrier embodiment.

FIG. 4 shows a stamped bump 26 according to an embodiment of the invention. In this example, the stamped bump 26 is cone-shaped and includes a tip 26*a* and a side portion 26*b*. The tip 26*a* is elevated with respect to the planar regions (e.g., a die attach region) of the carrier. The outer and/or inner surfaces of the tip 26*a* may be curved and may have a partial spherical shape.

The tip 26*a* of the bump 26 can be an interconnection point in the semiconductor die package. For example, the tip 26*a* of the bump 26 can contact a conductive land on a circuit substrate (not shown) so that the circuit substrate and the bump 26 are in electrical communication with each other. In some embodiments, the tip 26*a* of the bump 26 can be coupled to a conductive land using solder. The solder can be deposited around and/or under the tip 26*a* of the bump 26 to help stabilize the bump 26 on the land. The solder can also help enhance the conductivity between the bump 26 and the land. Although solder can be used to join the bump 26 to a conductive land on a circuit substrate, less solder is used in embodiments of the invention than in a semiconductor die package having all pure solder interconnects.

The bumps in the carrier embodiments may have any suitable shape. FIGS. 5 to 8 show examples of bumps with various shapes and dimensions. The stamped bumps may be cylindrical, round, square, etc. In some embodiments, the bumps are conical. The stamped bumps 26 may also have any suitable size or height depending upon the particular semiconductor die package that the carrier will be incorporated in.

Figure 5:
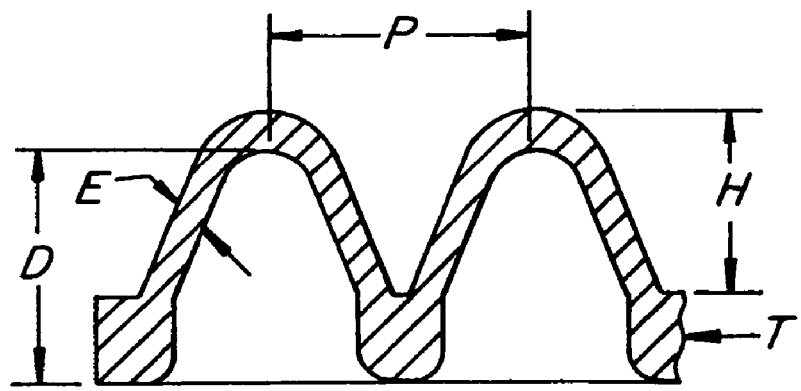
FIGS. 5–8 show side cross-sectional views of bumps formed in carriers according to embodiments of the invention.

Exemplary carrier and bump dimensions such as the bump pitch, the stamp depth, the bump wall thickness, the carrier thickness, and the bump height can be described with reference to FIG. 5. FIG. 5 shows a side cross-sectional view of stamped bumps in an exemplary carrier embodiment. The bump pitch is "P". The bump pitch P may be the center-to-center distance of adjacent bumps in an array. In some embodiments, the pitch P may be less than about 1 mm. For example, the pitch may be less than about 0.85 mm or less than about 0.65 mm (e.g., about 0.5 mm). The depth of the stamp is "D". In some embodiments, the depth of the stamp D may be about 0.850 mm or less. The bump wall thickness is "t". In some embodiments, the bump wall thickness t may be less than about 0.10 mm. The carrier thickness is "T". The carrier thickness T may be, for example, about 0.300 mm or less in some embodiments. The height of the bump is "H". The height of the bumps H may be about 0.500 to about 0.550 mm, or less in some embodiments. These and other specific dimensions are for purposes of illustration. It is understood that embodiments of the invention are not limited to carriers with the recited exemplary dimensions.

In embodiments of the invention, the tips of the stamped bumps are substantially coplanar. Because the bumps have tips that are substantially coplanar, all bumps in a carrier can contact conductive lands on a circuit substrate substantially simultaneously. Good electrical contact is made between the carrier bumps and the circuit substrate. Since all bumps contact the conductive lands at the same time, the likelihood of failure is due to a faulty interconnection between the conductive lands of a circuit substrate and the bumps is reduced. As will be explained in further detail below, a stamping process can be used to produce bumps with substantially coplanar tips. The stamped bumps are also robust and consistently positioned with respect to each other.

Figure 6:
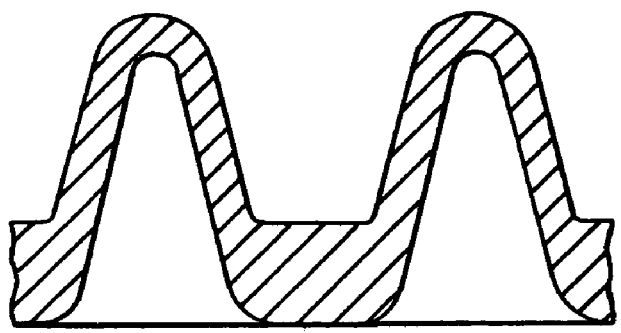

FIG. 6 shows another embodiment of the invention. In this embodiment, the bumps are cone-shaped. Each of the bumps shown in FIG. 6 has a conical angle of less than about 40°. A "conical angle" can be an angle formed by opposing wall surfaces of a cone. Cones can be defined by the inner or outer surfaces of a bump in the carrier. Each of the inner surface and the outer surface of a bump may form a conical angle. Cones can also be defined by the outer surface of a tip of a stamping element or by the surface defining a recess in a stamping die. These surfaces may also form conical angles.

In preferred embodiments of the invention, the conical angles formed by the bumps are wide. Typically, the conical angles (i.e., the angles formed by opposing inner or outer walls of the bump) of a bump are greater than about 40°. The surfaces defining the recesses in a stamping die and the surface defining the stamping elements can have conical angles of similar magnitude. In these embodiments, the stamping elements can be easily retracted from the recesses in the stamping die when forming the carrier. Bumps with large conical angles have a reduced likelihood of "sticking" to the stamping elements when they are withdrawn from the recesses of the stamping die. Bumps that stick to the stamping elements can be damaged in some cases.

Figure 7:
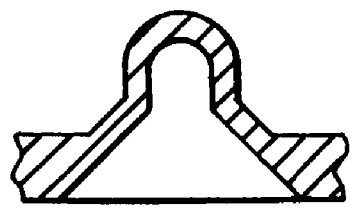

FIG. 7 shows another bump according to an embodiment of the invention. A lower portion of the bump has a conical angle of 90°. An upper portion of the bump is cylindrically shaped and has a curved tip. A portion of the curved tip is substantially spherical. The inner radius of curvature of the spherical tip portion is about 0.150 mm, while the outer radius of curvature is about 0.250 mm. Other exemplary dimensions (in millimeters) are also shown in FIG. 7.

Figure 8:
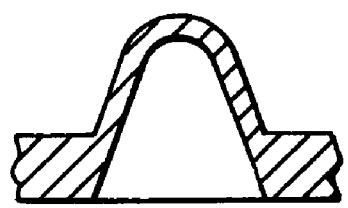

In FIG. 8, the illustrated bump is also conical. The portion of the bump at the tip of the bump has a substantially spherical configuration. Each of the conical angles formed by the inner and the outer surfaces of the bump is about 42° in this embodiment. Like the bump shown in FIG. 5, a portion of the curved tip is substantially spherical. The inner radius of curvature of the spherical tip portion is about 0.158 mm, while the outer radius of curvature is about 0.250 mm. Other exemplary dimensions (in millimeters) are also shown in FIG. 8.

Figure 9:
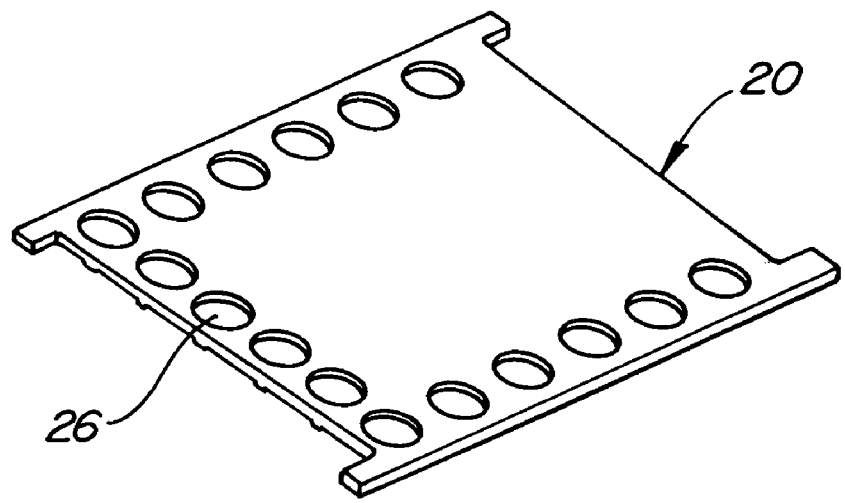
FIG. 9 shows a perspective view of the underside of a carrier according to an embodiment of the invention.

FIG. 9 shows the underside of the stamped bumps 26 in the backside of a carrier 20. Each of the stamped bumps can include hollow portions in the metal layer. As shown in FIG. 9, arrays of hollow portions are at the backside of the carrier. The shapes of the hollow portions can correspond to the shapes of the stamping elements used to form the stamped bumps.

Once the bumps are stamped and a carrier is formed, a semiconductor die can be attached to the carrier. For example, soft solder can be applied to the die attach region of the carrier. A semiconductor die can be placed on the soft solder and the semiconductor die can be attached to the carrier. After attaching the semiconductor die to the carrier, a bond line comprising the solder is formed between the carrier and the semiconductor die. In some embodiments, the bond line may have a thickness of about 1 mil (i.e., $\frac{1}{1000}^{th}$ of an inch) or less. During the die attach step, the solder flows towards the bumps at the periphery of the die attach region. In some embodiments, a groove (not shown) may be provided in the carrier at the periphery of the die attach region to receive any solder that flows to the bumps. The groove may be disposed between the bumps and the die attach region. In other embodiments, a conductive adhesive such as a conductive epoxy adhesive may be used to attach the semiconductor die to the carrier.

Figure 10:
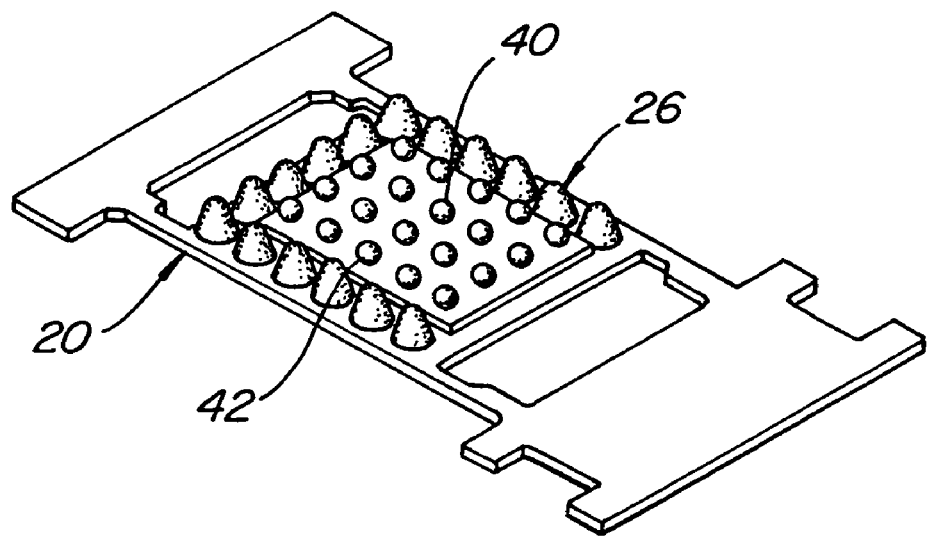
FIG. 10 shows a perspective view of a die package according to an embodiment of the invention.

FIG. 10 shows a semiconductor die package according to an embodiment of the invention. A semiconductor die 40 is mounted to a die attach region of the carrier 20. The stamped bumps 26 are disposed around the die attach region and the semiconductor die 40. The carrier 20 is also intimately connected to the semiconductor die. Accordingly, the carrier 20 can act as a low resistance thermal and electrical conduction path for the semiconductor die 40. In this Figure, the die package is shown as being attached to other structures through side rails. The side rails can be cut to separate the package from these other structures.

The semiconductor die 40 may comprise any suitable electronic device. For example, the semiconductor die 40 may comprise a metal oxide field effect transistor (MOSFET) device such as a power MOSFET device. The MOSFET device may have planar or trenched gate structures. Trenched gate structures are preferred. Transistor cells containing trenched gate structures are narrower than planar gate structures. In addition, the MOSFET device may be a vertical MOSFET device. In a vertical MOSFET device, the source region and the drain region are at opposite sides of the semiconductor die so that current in the transistor flows vertically through the semiconductor die. The semiconductor die 40 may comprise silicon or any other suitable semiconductor material.

The semiconductor die packages according to embodiments of the invention are particularly well suited for discrete products with high heat dissipation such as power switching devices (e.g., power MOSFETs) where electrical connection to the backside of the die (MOSFET drain terminal) is required. By using a thermally and electrically conductive material such as copper for carrier 20, the package provides for a very low resistance, compact connection between the backside of the die (the drain terminal of the power MOSFET) and a circuit substrate (e.g., a PCB).

Figure 11:
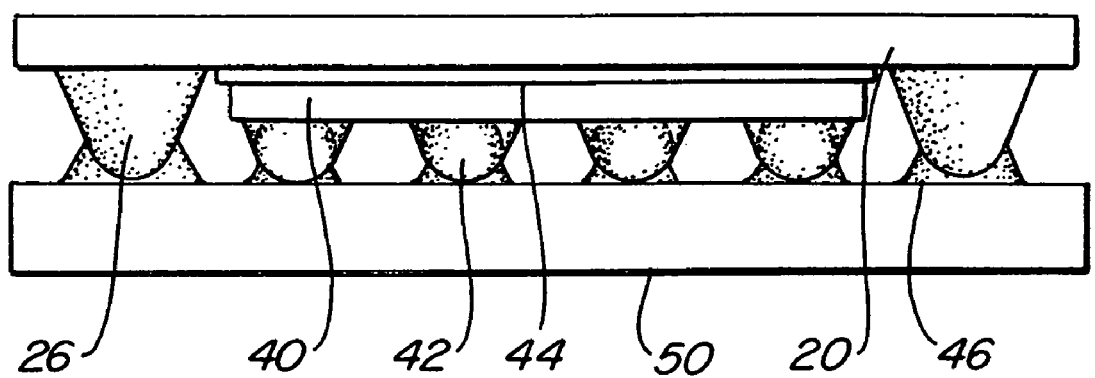
FIG. 11 shows a side view of a die package according to an embodiment of the invention.
Figure 12A:
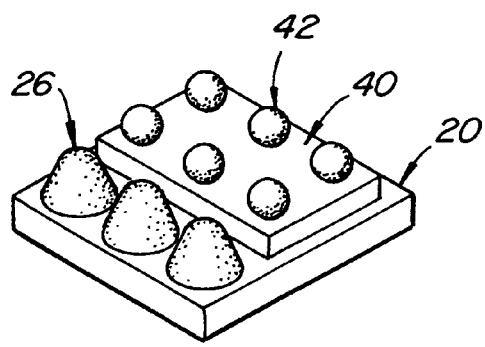
FIGS. 12a to 12f show perspective views of die packages according to embodiments of the invention.
Figure 12B:
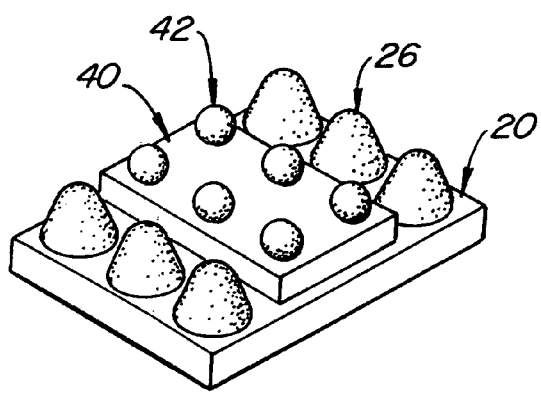
Figure 12C:
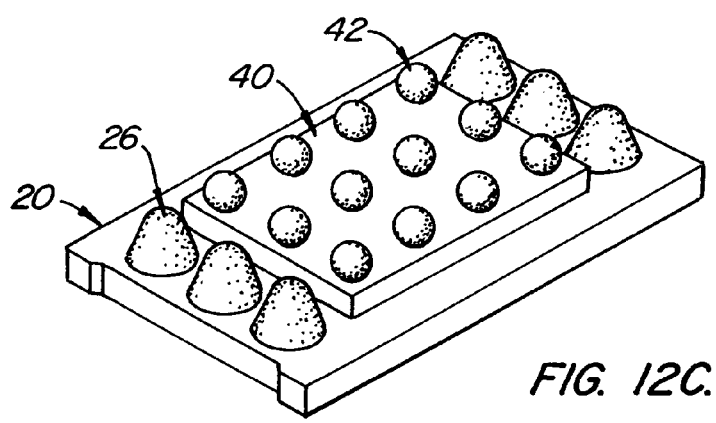
Figure 12D:
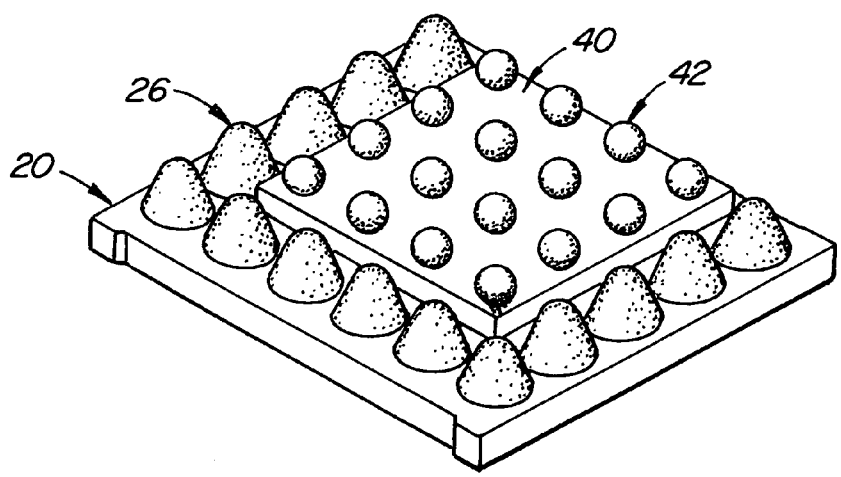
Figure 12E:
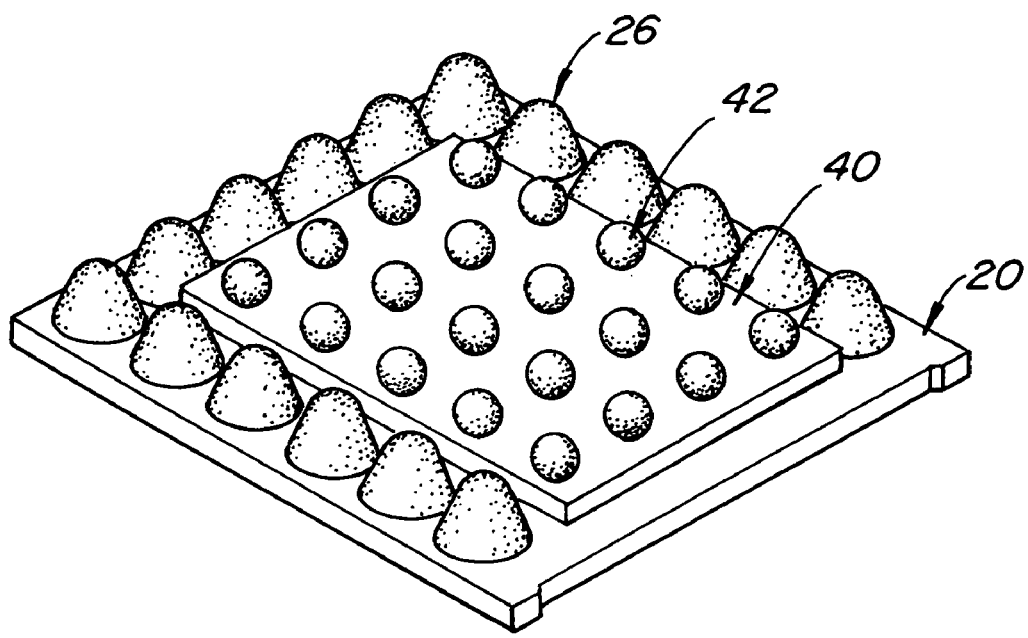
Figure 12F:
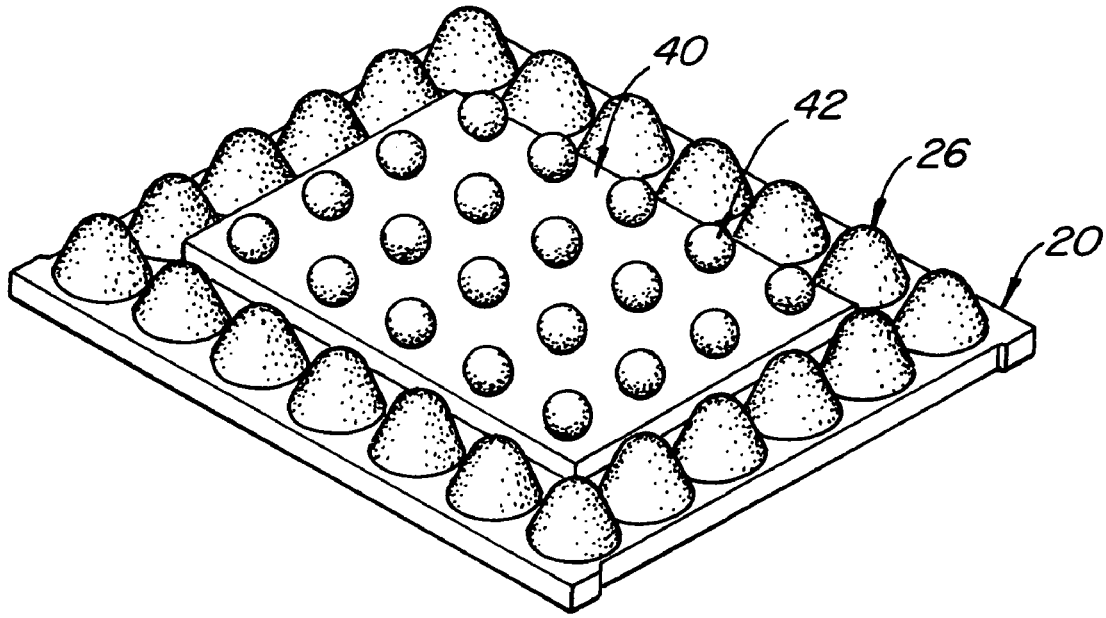

FIG. 11 shows a side view of a die package according to an embodiment of the invention. FIG. 11 shows a semiconductor die 40 disposed between a circuit substrate 50 (e.g., a circuit board) and a carrier 20. The carrier 20 is coupled to the semiconductor die 40 through a bond line 44. The bond line 44 may comprise, for example, a conductive adhesive or solder. A number of solder interconnects 42 are disposed between the semiconductor die 40 and the circuit substrate 50. The semiconductor die 40 and the circuit substrate 50 can communicate with each other through the solder interconnects 42. Solder paste 46 may be used to bond the stamped bumps 26 to the circuit substrate 50.

The semiconductor die 40 illustrated in FIG. 11 may comprise a vertical MOSFET device. One or more of the solder interconnects 42 can communicate with the source regions and the gate regions of the MOSFET in the semiconductor die 40. In this example, the source region and the gate region of the MOSFET device in the semiconductor die 40 are accessible through the underside of the semiconductor die 40. The carrier 20 can communicate with the drain region of the semiconductor die 40. In this example, the drain region of the semiconductor die 40 may be in contact with the bond line 44. Drain current can flow through the bond line 44, to the carrier 20, laterally to the stamped bumps 26 and to the circuit substrate 50.

Once the semiconductor die is joined to the circuit substrate, the semiconductor die can be covered to protect it from the environment. In a typical package, a lid can be attached to the circuit substrate and over the semiconductor die. Alternatively, an organic encapsulant can be deposited on the semiconductor die and cured.

FIGS. 12a to 12f show the perspective views of semiconductor die package examples according to embodiments of the invention. In each example, the stamped bumps 26 in the carrier 20 are disposed to one or more sides of the semiconductor die 40. For instance, a line of stamped bumps 26 can be at one, two, three, or four sides of a semiconductor die 40. In each example, the tips of the stamped bumps 26 are substantially coplanar with respect to each other and with the tips of the solder bumps 42 on the semiconductor dies 40.

Each of the semiconductor die packages shown in FIGS. 12a to 12f can be flipped over and mounted to a circuit substrate (not shown). When a die package is mounted to a circuit substrate, the tips of the solder bumps 42 and the tips of the stamped bumps 26 may contact conductive lands on a circuit substrate. The circuit substrate upon which the die package portion is mounted can provide a transistor in the semiconductor die 40 with a gate connection, a source connection, and a drain connection.

Figure 13:
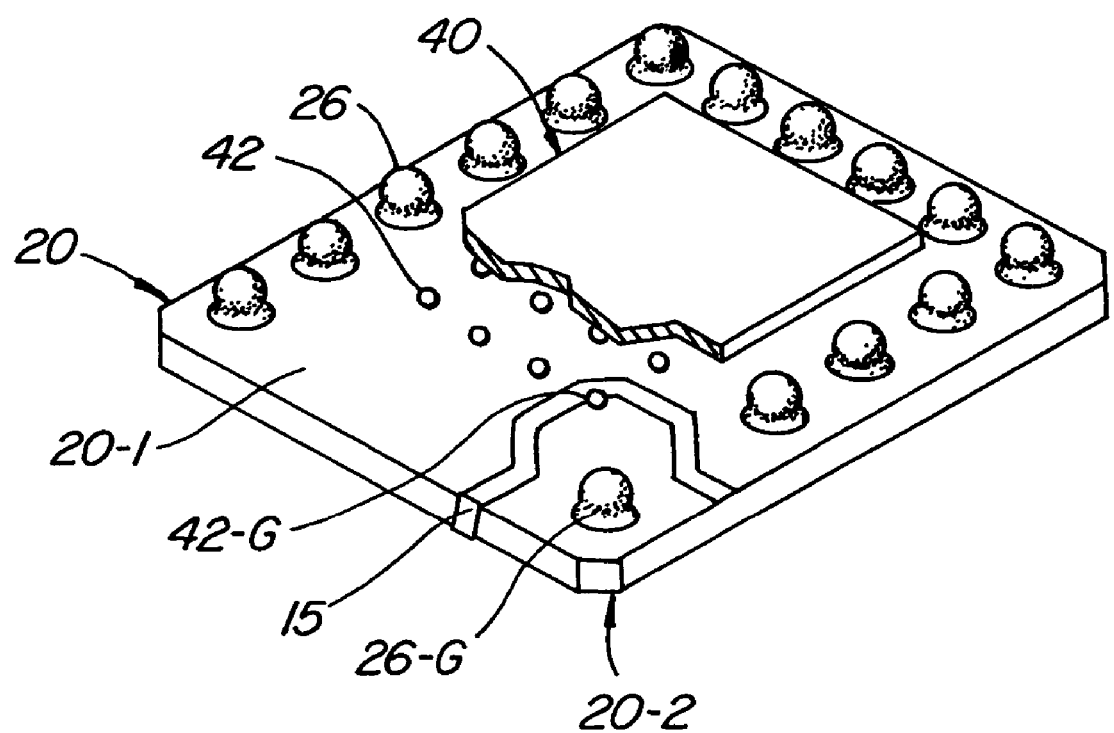
FIG. 13 shows a perspective view of a die package according to an embodiment of the invention where a portion of a semiconductor die is partially cut away to show solder balls underneath the semiconductor die.

FIG. 13 shows another embodiment of the invention. In the FIG. 13, a portion of the semiconductor die 40 is cut away to show the region underneath the semiconductor die 40. Solder balls 42 are disposed between the semiconductor die 40 and the carrier 20. These solder balls 42 electrically couple the source and the gate regions (not shown) of a MOSFET device in the semiconductor die 40 to the carrier. The drain region of the MOSFET device in the semiconductor die 40 in this example faces upward and is distal to the carrier 20, while the source and the gate regions are proximate to the carrier 20. Most of the solder balls 42 under the semiconductor die 40 are coupled to a first portion 20-1 of the carrier 20. These solder balls can be coupled to the source regions in the MOSFET device in the semiconductor die 40. The solder ball 42-G on a second portion 20-2 of the carrier 20 can be coupled to a gate region of the MOSFET device. Gate current can pass through a stamped bump 26-G at the corner of the carrier 20, through the second portion 20-2 of the carrier 20, to the solder ball 42-G, and to the semiconductor die 40. A dielectric region 15 is between the first and the second carrier portions 20-1, 20-2. The dielectric region may be, for example, a dielectric adhesive that joins the first and the second carrier portions 20-1, 20-2. The package shown in FIG. 13 can be flipped over and mounted to a circuit substrate (not shown). The circuit substrate can have conductive lands corresponding to the drain region, the source region, and the gate region of the MOSFET.

The carrier 20 shown in FIG. 13 can be formed in any suitable manner. For example, a rectangular metal layer can be stamped with bumps 26, 26-G. First and second carrier portions 20-1, 20-2 can be formed by cutting the metal layer. The cut line can correspond to the line formed by the dielectric region 15. After cutting, the first and the second carrier portions 20-1, 20-2 can be joined using a dielectric adhesive material (e.g., a dielectric epoxy adhesive).

Figure 14A:
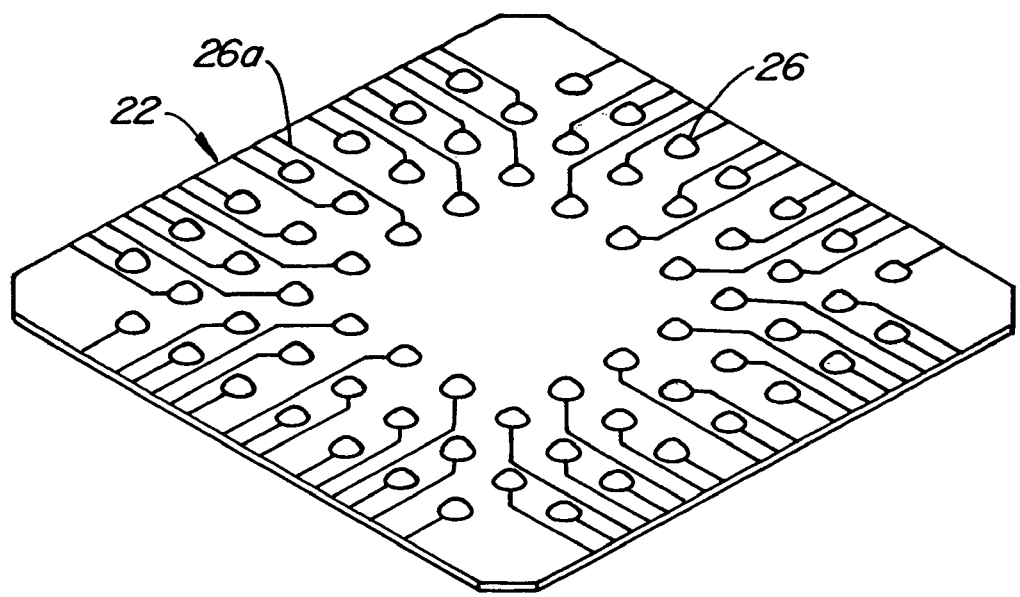
FIG. 14a shows a bottom perspective view of a carrier for a semiconductor die BGA type package according to an embodiment of the invention.

FIGS. 14a to 14e show the application and use of a bumped carrier (e.g., a copper bumped carrier) in an IC (integrated circuit) BGA type die package. FIG. 14a shows a carrier 22 with an array of stamped bumps 26. Conductive traces 26a (e.g., conductive lines) are on the carrier 22 and lead to the stamped bumps 26. Both the stamped bumps 26 and the conductive traces 26a can be present in a single metal layer. These conductive traces 26a can be electrically coupled to traces on the other side of the carrier 22. As shown in FIG. 14a, the tips of the stamped bumps 26 are substantially coplanar. In comparison to the carrier shown in FIG. 2, for example, the bumps 26 may be formed across the surface of the metal layer and not just at the periphery of a die attach region of the carrier 22. Moreover, in comparison to the carrier shown in FIG. 2, for example, the carrier shown in FIGS. 14a to 14e can be an interposer that can be disposed between the semiconductor die and a circuit substrate (e.g., a circuit board).

Figure 14B:
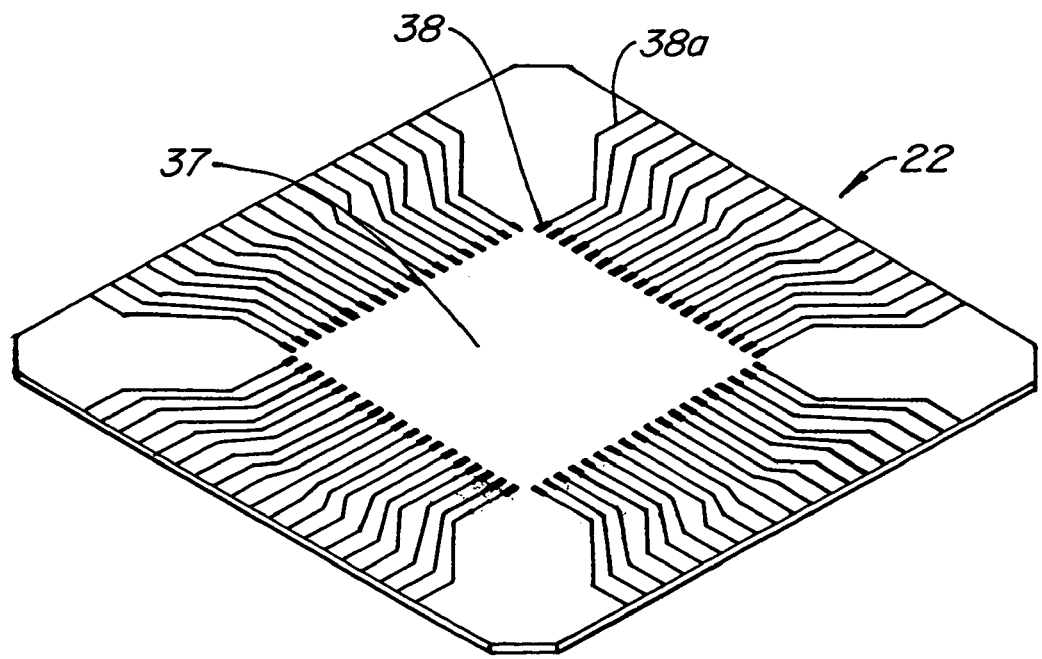
FIG. 14b shows a top perspective view of a carrier for a semiconductor die BGA type package according to an embodiment of the invention.

FIG. 14b shows the opposite side of the carrier 22 as shown in FIG. 14a. A semiconductor die (not shown) may be attached to a die attach region 37 of the carrier 22. Leads to the attached semiconductor die can be electrically coupled to conductive lands 38. Circuit traces 38a lead to the conductive lands 38 and can be coupled to the circuit traces 26a on the other side of the carrier 22.

Figure 14C:
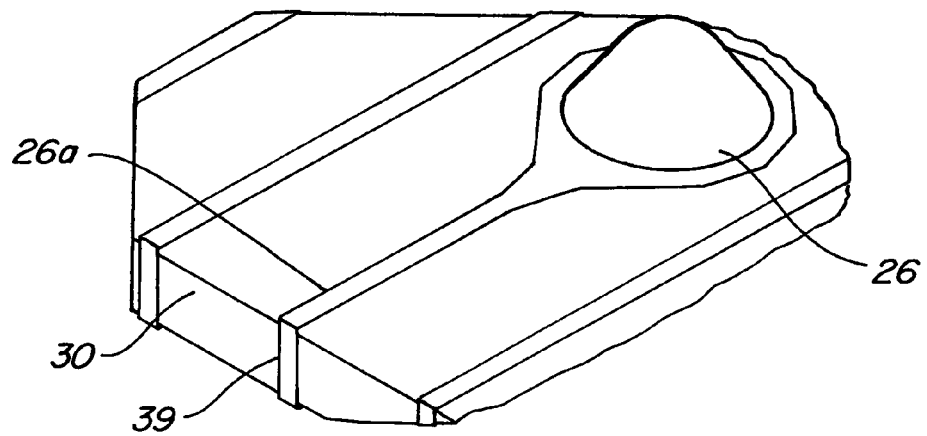
FIG. 14c shows a close up view of a bump and a conductive bridge of a carrier.

FIG. 14c is a close-up view of a bump 26 and the edge of the carrier. A conductive bridge 39 is at the edge of a dielectric layer 30 and at the edge of the carrier. Conductive traces on opposite sides of the carrier can be coupled through the conductive bridge 39 (e.g., a conductive via). The conductive bridge 39 is vertical with respect to the orientation of the carrier 22.

Figure 14D:
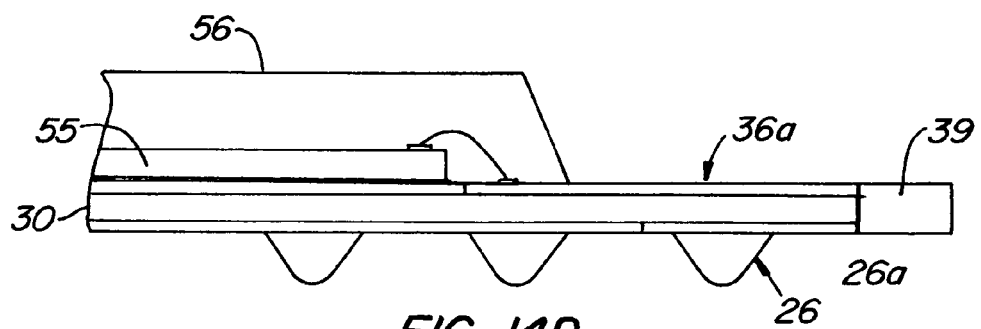
FIG. 14d shows a side view of a semiconductor die BGA type package with a wire bond.
Figure 14E:
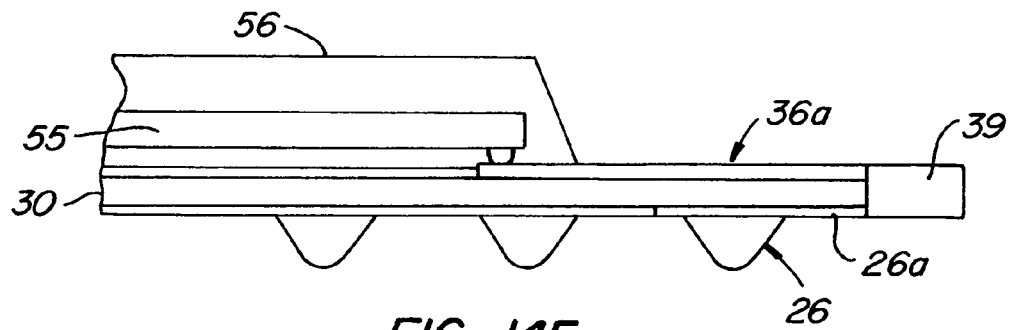
FIG. 14e shows a side view of a semiconductor die BGA type package that has a flip chip type configuration.

FIGS. 14d to 14e show side cross-sectional views of IC-type packages using the carriers according to embodiments of the invention. FIG. 14d shows an IC type package with a wire bond coupling a semiconductor die to the carrier. FIG. 14e shows an IC chip type package where the semiconductor die is mounted in a flip-chip manner without a wire-bond. The semiconductor die communicates with the carrier through solder balls.

In both FIGS. 14d and 14e, the carrier comprises a metal layer with stamped bumps 26 and a conductive trace 26a on a dielectric layer 30. A conductive trace 36a is on the side of the dielectric layer 30 opposite the conductive trace 26a leading to the stamped bump 26. An IC die 55 is on the dielectric layer 30 and is electrically coupled to the circuit trace 36a. A cover 56 can cover the die 55 to protect the die 55.

The semiconductor die packages shown in FIGS. 14d and 14e can be mounted to the conductive lands of a circuit substrate such as a circuit board. For example, the stamped bumps 26 can be soldered to conductive lands on the circuit substrate.

The carrier shown in FIGS. 14a to 14e can be formed in any suitable manner. In one exemplary process, a first metal layer can be stamped with a plurality of bumps. The first metal layer can then be bonded (e.g., using an adhesive or using a lamination process) to a dielectric layer. After bonding, the first metal layer can be etched to form circuit traces. For example, as shown in FIG. 14c, regions around a formed bump 26 can be etched and the circuit trace 26a that is formed can lead to the bump 26. A second metal layer can then be bonded (e.g., using an adhesive or using a lamination process) to the side of the dielectric layer opposite the bumps. The second metal layer can then be etched to form conductive traces and conductive pads. A semiconductor die can be mounted on the conductive pads. Conductive bridges (e.g., vias) can then be formed on the side of the dielectric layer or through the dielectric layer to communicate the conductive traces at opposite sides of the carrier. After the carrier is formed, a semiconductor die can be mounted to the conductive pads of the carrier using conventional processes. It is noted that the above-described process is a subtractive process. In other embodiments, it is possible to use an additive process to form conductive traces and conductive pads on the dielectric layer. Additive processes are well known in the art.

Figure 15A:
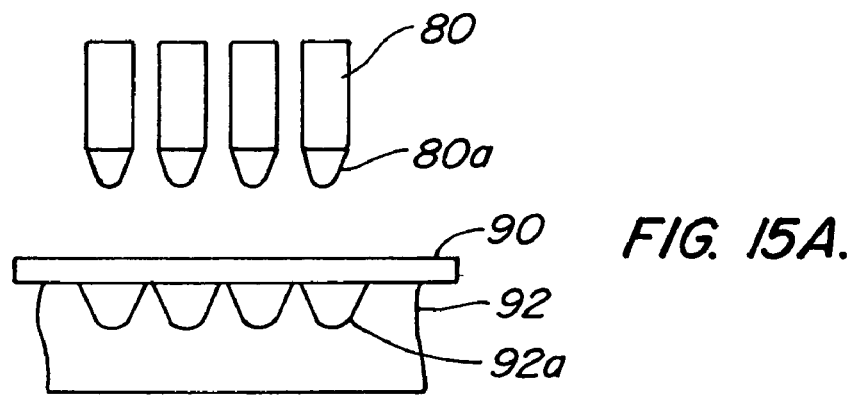
FIGS. 15a to 15g show side cross-sectional views of a stamping apparatus as it is used when forming a carrier according to an embodiment of the invention.

In some embodiments, many carriers can be formed from a metal layer that is in the form of a strip. Referring to FIG. 15a, a planar metal layer 90 is disposed on a stamping die 92 in a stamping apparatus. The stamping die 92 has a number of cavities 92(a) that correspond to the shapes of the bumps that will be formed in the metal layer 90. Each of the recesses 92(a) may define a conical shape. A stamper 80 including a plurality of stamping elements 80(a) is disposed above the stamping die 92 and the metal layer 90. Each stamping element 80(a) may have a conical tip. The tips of the stamping elements 80(a) may be conical. Both the stamper 80 and the stamping die 92 can comprise materials that are harder than the metal layer 90. For example, in some embodiments, the stamper 90 and the stamping element 80 can be made of steel, while the metal layer 90 may be made of copper. The metal layer 90 can be a continuous sheet of copper. In addition, the stamping elements 80(a) of the stamper 80 may be cooperatively structured with the recesses 92(a) in the stamping die 92. During stamping, bumps are formed in the metal layer 90. The pressure applied by the stamper 80 can be selected according to the depth of the stamp desired, the particular product being produced, etc.

Figure 15B:
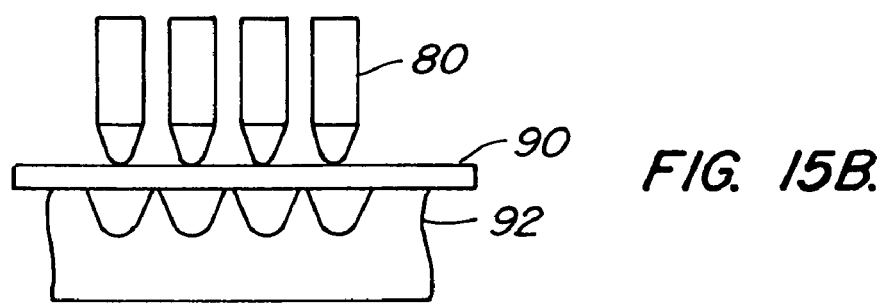
Figure 15C:
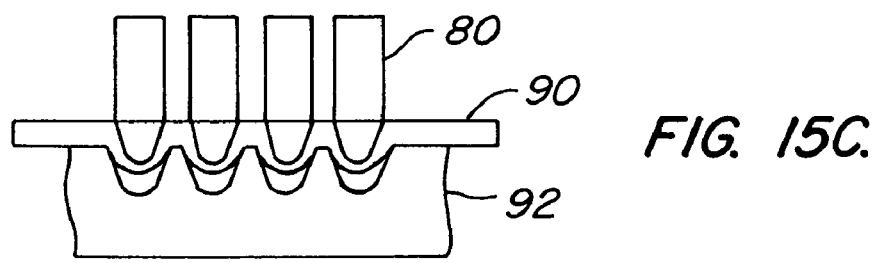
Figure 15D:
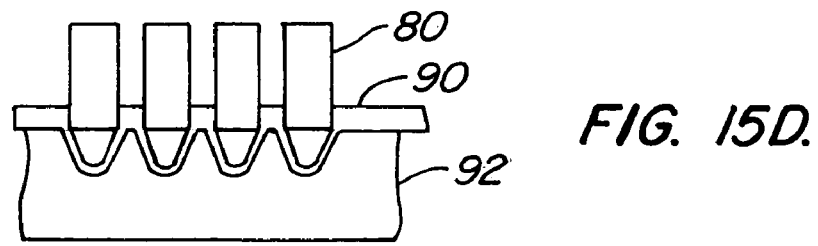
Figure 15E:
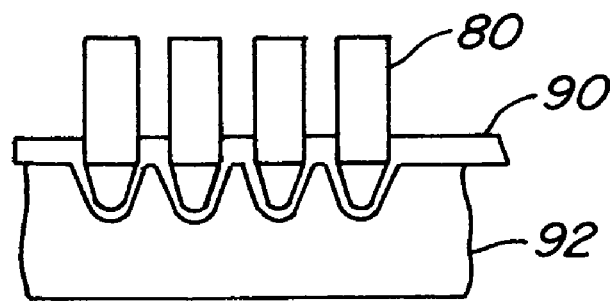

Referring to FIGS. 15b and 15e, the stamper 80 may move in a downward direction toward the stamping die 92. The stamping elements 80(a) contact the metal layer 90 and punch portions of the metal layer 90 to deform them. During punching, the stamping elements 80(a) pass into the cavity 92(a) of the stamping die 92 until the deforming portions of the metal layer contact the ends of the cavity 92(a). Portions of the metal layer 90 are sandwiched between the walls defining the cavity 92(a) and the tips of the stamping elements 92(a). The portions of the metal layer 90 conform to the spaces between the stamping elements 80(a) and the stamping element tips. The ends of the cavity 92(a) in the stamping die are coplanar with each other. Consequently, the bumps formed in the cavity 92(a) have tips that are coplanar with each other.

Figure 15F:
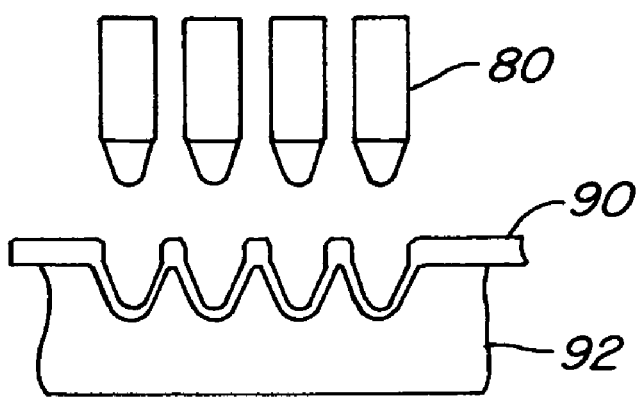

As shown in FIG. 15f, after stamping the metal layer 90, the stamper 80 is retracted and moves in an upward direction away from the stamping die 92. The ends of the stamping elements 80(*a*) of the stamper 80 are withdrawn from the recesses in the stamping die 92, while the stamped metal layer 90 remains on the stamping die 92.

Figure 15G:
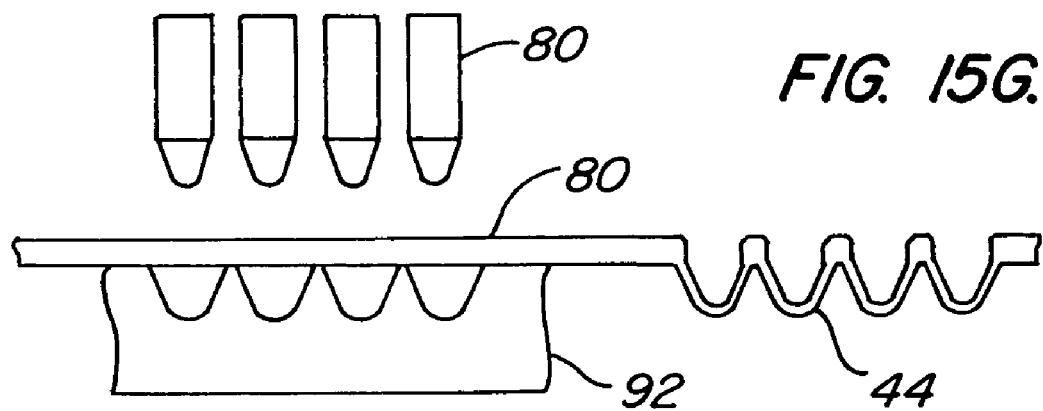

Referring to FIG. 15*g*, after the stamper 80 is retracted, the stamped metal layer 90 can then be lifted off of the stamping die 92. Another flat portion of the metal layer 90 can then be placed over the recesses of the stamping die 92. The flat portion can be stamped to form another set of bumps for another carrier.

Once multiple bumped carriers are formed in the metal strip, semiconductor dies can be attached to the carriers in the strip using, for example, a conductive adhesive or solder. The carriers and semiconductor die units can then be marked, tested, and then separated into individual units. Additional packaging steps may also be performed.

EXAMPLES

A number of stamped carriers with stamped bumps were produced. Bumps were formed in copper layers according to the process generally illustrated in FIG. 15*a* to 15*g*. Semiconductor dies comprising vertical power MOSFETs were mounted to the carriers using solder to form a number of carrier/semiconductor die units. The carrier/semiconductor die units were then separated from each other. Each carrier/semiconductor die unit was then manually mounted to a 1 square inch chipboard using a 6337 type of solder paste (63% Sn and 37% Pb) to form die.packages. The assembled die packages were then processed in an infrared reflow oven. After the reflow process, each die package was inspected for adhesive strength and position accuracy. The resulting packages had a configuration similar to the one shown in FIG. 11.

A number of characteristics were evaluated in the formed packages. The copper bump height distribution, the solder bump height distribution, and the coplanarity of the solder bumps and copper bumps with respect to a die attach pad (DAP) were evaluated. The on-state resistance, RdSon, was also evaluated.

Figure 16:
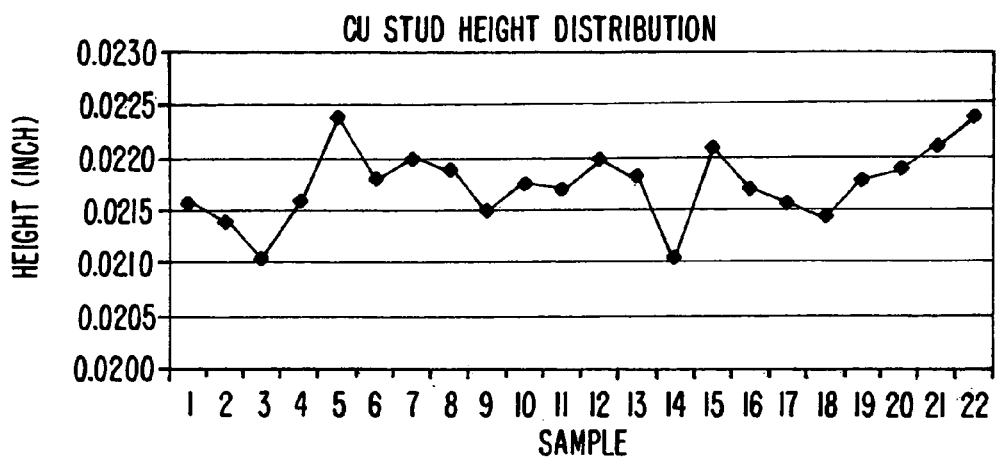
FIG. 16 shows a graph of the copper bump height vs. carrier sample.

The graph in FIG. 16 shows the copper bump height variation in different carriers. The height varied from about 21.05 to about 22.40 mils from a target of about 21.0 mils. The targeted copper bump height was based on the sum of the die thickness, the nominal solder bump height, and the bondline thickness, which were 8 mils, 12 mils, and 1 mil, respectively.

Figure 17:
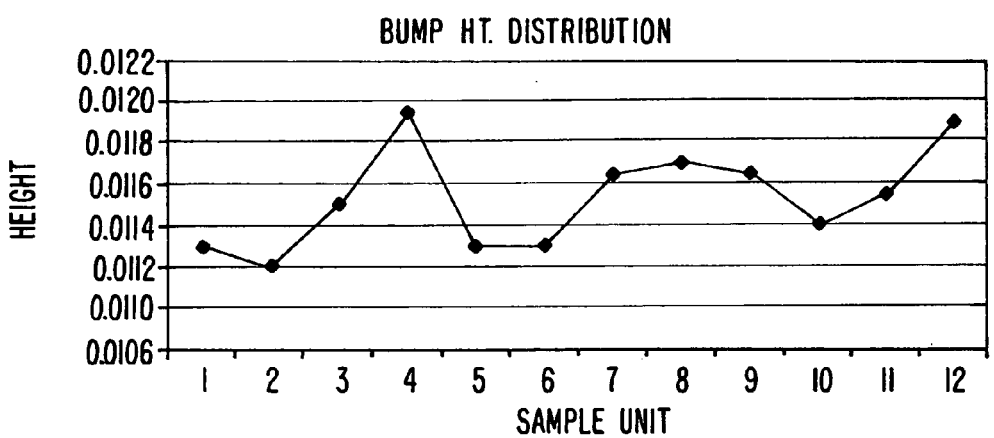
FIG. 17 shows a graph of solder bump height distribution vs. package sample unit.

The solder bumps disposed between the semiconductor die and the chip board were also evaluated for height variation. The graph in FIG. 17 shows the bump height variation from die-to-die. The solder bumps had heights of about 11.2 mils to about 11.95 mils. There was no significant height difference between solder bumps for the gate and source terminals.

Figure 18:
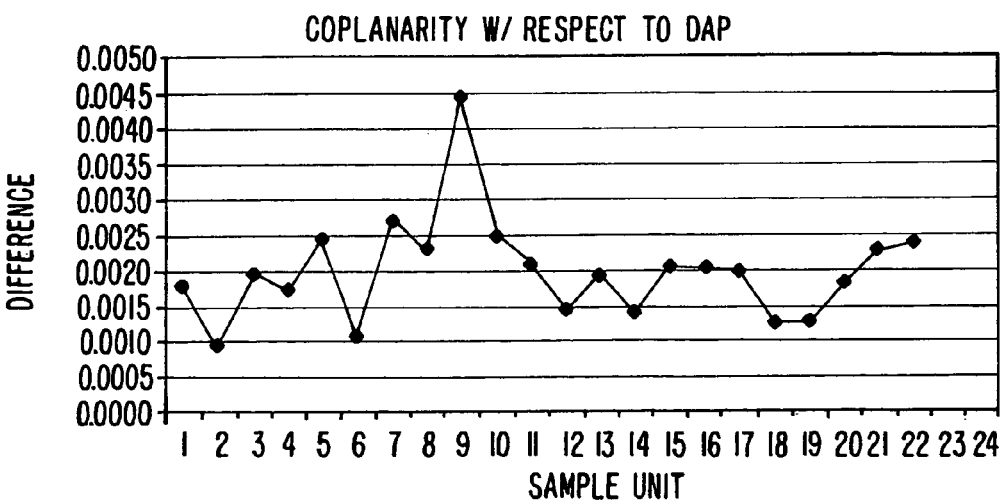
FIG. 18 shows a graph of the height difference of the copper bumps and the combined height of the solder balls, bond line, and semiconductor die in the package vs. package sample unit.

In FIG. 18, measurements of the coplanarity of the solder bump height and copper bump height are shown. Using the die attach pad as a reference, the average total height of the semiconductor die, the solder bumps, and the bondline was about 20.19 mils. The average height of the copper bumps was about 21 mils. The average difference in the total height vs. the height of the copper bumps was about 1 to about 2 mils. The data show that the copper bumps were almost perfectly coplanar with the solder bumps.

Figure 19:
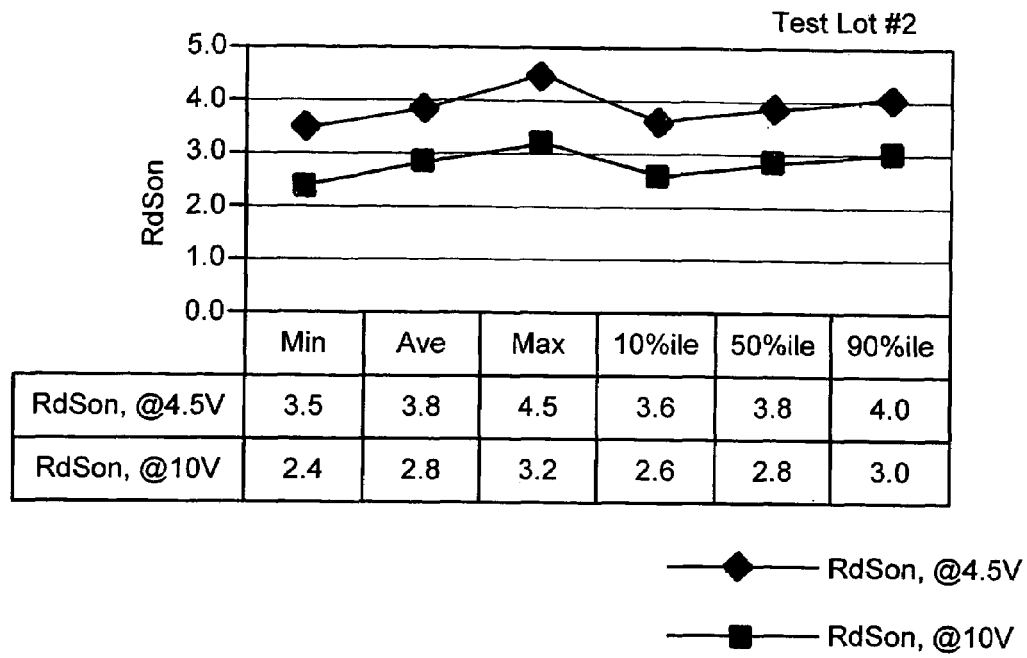
FIGS. 19 and 20 show graphs of RdSon for two different electrically tested lots.
Figure 20:
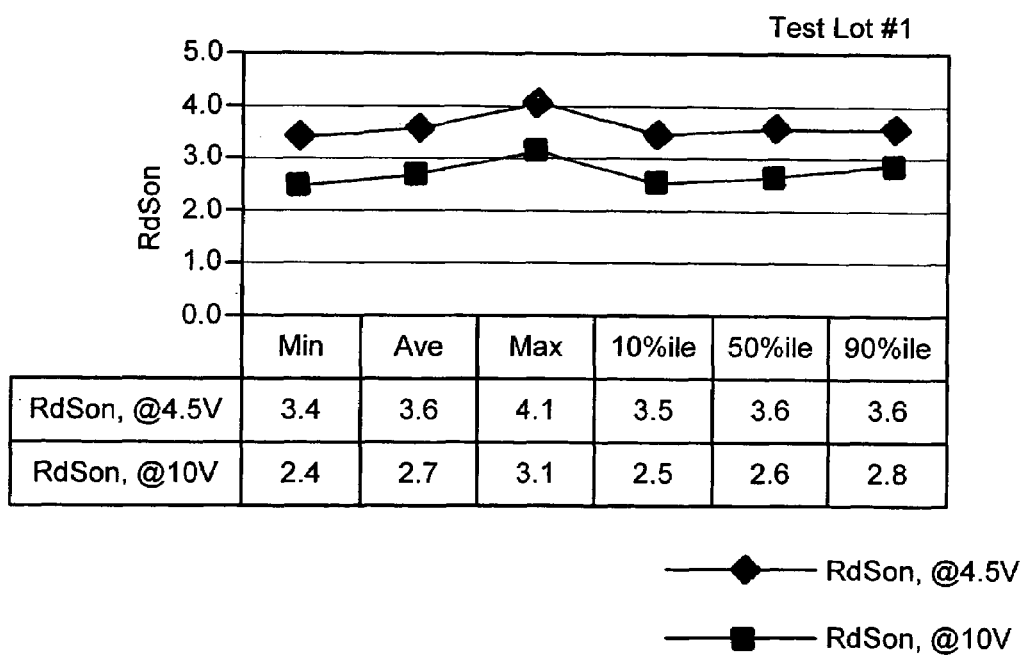

Electrical tests were also conducted to evaluate the properties of the stamped bumps. In particular, the drain-to-source on-state resistance or RdSon (which is defined as the total resistance encountered by a drain current) in embodiments of the invention was comparable to the RdSon obtained in semiconductor die packages using solder bumps instead of stamped bumps as interconnects. With reference to FIG. 19, the RdSon values for the copper bump embodiments were about 3.5 to about 4.0 milliohms at 4.5V, and about 2.4 about 3.2 milliohms at about 10V. With reference to FIG. 20, the RdSon values for the copper bump embodiments were about 3.5 to about 4.0 milliohms at 4.5V, and about 2.4 and about 3.2 milliohms at 10V. The RdSon values shown in FIGS. 19 and 20 are comparable to RdSon values obtained from a MOSFET BGA using solder balls as interconnects instead of stamped bumps.

The terms and expressions which have been employed herein are used as terms of description and not of limitation. There is no intention in the use of such terms and expressions of excluding equivalents of the features as shown and described. The portions thereof, are recognized that various modifications are possible within the scope of the invention as claimed. Moreover, any one or more features of any embodiment of the invention may be combined with any one or more other features of any other embodiment of the invention, without departing from the scope of the invention.

What is claimed is:

1. A semiconductor die package comprising:
   (a) a carrier comprising a metal layer, a die attach region, and a plurality of bumps formed in the metal layer; and
   (b) a semiconductor die electrically coupled to the die attach region of the carrier,
   wherein the plurality of bumps are stamped bumps and are arranged around the die attach region, and wherein each of the bumps has a height that is greater than or equal to a thickness of the semiconductor die.

2. The die package of claim 1 wherein the carrier comprises copper.

3. The die package of claim 1 wherein the carrier comprises:
   a base metal with one or more coatings on the base metal.

4. The die package of claim 1 wherein each bump has a conical angle greater than about 40 degrees.

5. The die package of claim 1 wherein the semiconductor die comprises a vertical metal oxide semiconductor field effect transistor (MOSFET) device.

6. The die package of claim 1 wherein the semiconductor die comprises a vertical metal oxide semiconductor field effect transistor (MOSFET) device having a source region, a gate region, and a drain region, wherein the drain region is proximate to the die attach region of the carrier, and the source region and the gate region are distal to the die attach region of the carrier.

7. The die package of claim 1 wherein each stamped bump has a conical shape.

8. The die package of claim 1 wherein the bumps and the semiconductor die are at opposite sides of the carrier.

9. The die package of claim 1 wherein the bumps and the semiconductor die are at the same side of the carrier.

10. A semiconductor die package comprising:
    (a) a carrier comprising metal layer, a die attach region, and a plurality of stamped bumps formed in the metal layer around the die attach region;
    (b) a semiconductor die comprising a vertical metal oxide semiconductor field effect transistor (MOSFET) device having a source region, a gate region, and a drain region, wherein the drain region is electrically coupled to and proximate to the die attach region of the carrier, and the source region and the gate region are distal to the die attach region, and wherein the plurality of stamped bumps in the carrier are arranged around the semiconductor die; and (c) a plurality of solder deposits disposed on the semiconductor die.

11. The semiconductor die package of claim 10 wherein the each of the bumps has a conical angle greater than about 40 degrees or more.

12. The semiconductor die package of claim 10 wherein the carrier comprises copper.

13. The semiconductor die package of claim 10 the plurality of bumps are formed simultaneously in the metal layer.

14. A carrier for a semiconductor die package, the carrier comprising:
a metal layer;
a plurality of stamped bumps formed in the metal layer;
a die attach region for receiving a semiconductor die, wherein the die attach region is in the metal layer and is disposed between and connects stamped bumps on opposite sides of the semiconductor die,
wherein each of the stamped bumps in the plurality of bumps has a height greater than the semiconductor die.

15. The carrier of claim 14 wherein the metal layer comprises copper.

16. The carrier of claim 14 wherein the metal layer includes one or more sublayers of material on a base metal.

17. The carrier of claim 14 wherein the each of the bumps has a conical angle greater than about 40 degrees or more.

* * * * *